United States Patent [19]

Wade et al.

[11] Patent Number: 5,130,228
[45] Date of Patent: Jul. 14, 1992

[54] RADIATION SENSITIVE COMPOSITIONS

[75] Inventors: John R. Wade, Otley; Terrence Etherington; Christopher W. Folkard, both of Leeds, all of United Kingdom

[73] Assignee: DuPont-Howson Limited, London, United Kingdom

[21] Appl. No.: 581,543

[22] Filed: Sep. 12, 1990

[30] Foreign Application Priority Data

Sep. 18, 1989 [GB] United Kingdom ............... 8921116

[51] Int. Cl.⁵ .............................................. G03C 5/00
[52] U.S. Cl. .................................. 430/292; 430/270; 430/280; 430/281
[58] Field of Search ............... 430/270, 281, 292, 280

[56] References Cited

U.S. PATENT DOCUMENTS

| 4,349,619 | 9/1982 | Kamoshida et al. | 430/270 |
| 4,659,649 | 4/1987 | Dickinson et al. | 430/280 |
| 4,687,728 | 8/1987 | Folkard et al. | 430/270 |
| 4,743,531 | 5/1988 | Farid et al. | 430/281 |
| 4,876,175 | 10/1989 | Chen et al. | 430/281 |
| 4,950,581 | 8/1990 | Koike et al. | 430/281 |

Primary Examiner—Marion E. McCamish
Assistant Examiner—Mark A. Chapman
Attorney, Agent, or Firm—Francis C. Hand

[57] ABSTRACT

A radiation sensitive composition comprises a radiation sensitive material and a dye which dye undergoes a color change in the radiation-struck areas on imagewise exposure of the composition and a color change when the exposed and developed composition is heated to a temperature of at least 180° C.

10 Claims, No Drawings

RADIATION SENSITIVE COMPOSITIONS

This invention relates radiation sensitive compositions, to radiation sensitive devices, in particular radiation sensitive plates for lithographic printing plate production and photo-resists comprising substrates coated with such compositions, and to the processing of such radiation sensitive devices.

Radiation sensitive devices of the type with which the present invention is concerned conventionally consist of a radiation sensitive composition coated on a suitable substrate. Image-wise exposure of the device to radiation using a suitable transparency causes the coating to change its characterisitics in the areas struck by radiation so that the coating may be selectively removed from the substrate in the non-image areas by application of a suitable developer to leave a printing image (or etch resistant area) on the substrate. In the case of the so-called negative-working devices, it is the non-radiation-struck areas of the coating which are removed.

It is desirable that, after image-wise exposure of the composition, an indication is provided which enables the easy differentiation of the radiation struck and non-radiation struck areas. Thus any unwanted image areas can easily be removed by conventional means, if necessary.

In this respect it is well known to incorporate into the radiation sensitive composition a dye, for example a pH sensitive dye, which undergoes a colour change on exposure of the composition.

As is also well known, it is possible to strengthen printing images or etch resistant areas by baking or burning-in the processed devices at a temperature of 180° C. or above. In the case of some lithographic printing plates, the run length can be extended by 2 or 3 times using such treatment.

It is desirable that some indication is provided that the device has been baked and moreover that the device has been sufficiently baked to obtain the maximum effect. In this respect it is known to incorporate into the radiation sensitive composition a heat sensitive dye which undergoes a colour change at elevated temperature.

It is an object of this invention to provide such indications both on exposure and on baking and this is achieved in accordance with the present invention by incorporating into the radiation sensitive compositions a dye which undergoes a colour change on exposure of the composition to radiation and also at a temperature of 180° C. or more.

Accordingly, one aspect of the present invention provides a radiation sensitive composition comprising a radiation sensitive material and a dye characterised in that, on image-wise exposure of the composition so that the composition comprises radiation-struck areas and non-radiation-struck areas, the dye undergoes a colour change in the radiation-struck areas and in that the dye is a heat sensitive dye which undergoes a colour change at a temperature of at least 180° C.

Any radiation-sensitive material may be used in the composition of the present invention provided that the material is not so acidic as to cause a premature colour change of the dye. Whilst the radiation sensitive components of some compositions may not in themselves benefit from baking, an improvement in the strength of such compositions in which such components are incorporated may be obtained by including, in the compositions, a support resin which does benefit from baking.

In the case where the composition is coated onto a substrate to form a radiation sensitive device, the substrate may be, for example, grained and anodised aluminum or other substrate conventionally used in the production of lithographic printing plates or in etching processes.

In use of such radiation sensitive devices the radiation sensitive composition is image-wise exposed to radiation with the result that the dye in the radiation struck areas of the composition is caused to undergo a colour change. Thus there is a colour contrast between the radiation struck areas and the non-radiation struck areas. The device is then developed to selectively remove the more soluble areas of the composition and reveal the underlying substrate and to leave an image on the substrate constituted by the less soluble areas. In the case where the device is negative-working, the less soluble image areas are the radiation struck areas and the developed device is subsequently baked until the radiation struck areas undergo a second colour change. In the case where the device is positive-working, the less soluble image areas are the non-radiation struck areas and thus, on development it is the radiation struck areas (which have previously undergone the colour change) which are selectively removed from the substrate. Subsequent baking of the developed device is then carried out until the dye in the non-radiation struck image areas undergoes a colour change. In both cases it can readily be ascertained that the developed device has been heated to the required temperature. The actual colours involved will depend upon the particular dye used and upon any colour inherently present as a consequence of other components of the radiation sensitive composition.

According to another aspect of the present invention there is provided a method of processing a radiation sensitive device which comprises a substrate coated with a radiation sensitive composition comprising a radiation sensitive material and a dye, which method comprises:

(i) image-wise exposing the composition to radiation so that the composition comprises radiation-struck areas and non-radiation-struck areas of differing solubility, (ii) developing the image-wise exposed composition to selectively remove the more soluble areas and to reveal the substrate underlying these areas, and (iii) heating the less soluble areas remaining on the substrate after development to a temperature of at least 180° C.

characterised in that on exposure the dye undergoes a colour change in the radiation struck areas and in that the dye undergoes a colour change on heating, to a temperature of at least 180° C., the less soluble areas remaining on the substrate.

According to a further aspect of the invention there is provided a radiation sensitive device comprising a substrate coated with a radiation sensitive composition as defined above.

In a particularly preferred embodiment of the invention, the dye is a pH sensitive dye and the radiation sensitive composition further comprises an acid release agent which produces acid on exposure of the composition.

A well known disadvantage of baking some radiation sensitive devices is that during the baking step contaminating residues are formed and these become deposited on the background areas (i.e. the non-image areas of the printing plate or the areas to be etched of the photoresist). This is particularly serious in the case where the device is to be used in the production of a lithographic printing plate as the contaminating residues cause scumming during subsequent printing and render the printing plate useless even if they are present to only a small degree.

This problem can be overcome by treating the device with a processing liquid before baking in accordance with the Thermotect (TM) process described in U.K. Patent No. 1513368 whereby a thin coating of a protective substance is applied to the device before baking. This protective substance forms a layer which shields the background areas from the contaminating residues and, as it is water soluble and remains water soluble during the baking step, it and the contaminating residues can be readily washed off with water after the baking step, In an embodiment of the invention, prior to heating, the developed device is coated with a processing liquid comprising a protective substance to shield the revealed underlying substrate from contaminating residues formed when the developed device is heated to a temperature of at least 180° C. and, after heating, the developed device is washed to remove the coating.

The protective substance in the processing liquid may be any one of, or a mixture of, the substances described in U.K. Patents Nos. 1513368, 1534424 and 1555233 or U.K. Patent Application No. 2099371 and it is advantageous for the processing liquid also to contain a film forming agent, for example poly(vinyl alcohol). It is particularly preferred for the protective substance to be a surfactant such as sodium dodecyl phenoxy benzene disulphonate, a sodium salt of an alkylated naphthalene sulphonic acid, the disodium salt of methylene dinaphthalene sulphonic acid, sodium dodecyl benzene sulphonate, or a sodium salt of a sulphonated alkyl diphenyl oxide.

In a preferred embodiment of the invention the dye comprises the product of the condensation reaction of an aromatic dialkylamino substituted aldehyde and a methylene group attached to a nitrogen containing heterocycle. In such a case the dye may include a chromophoric resonance conjugation system with a positive charge being distributed over the system.

In a particularly preferred embodiment of the invention, the methylene group is generated in situ from a quaternary ammonium salt of the nitrogen containing heterocycle.

Particularly preferred dyes of the present invention have the general structure:

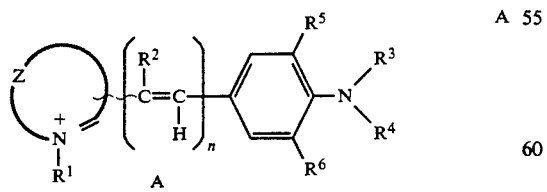

A where
Z—represents a divalent group which forms a heterocycle ring structure with the nitrogen atom, and n=1 or 2.
$R^1$—represents an optionally substituted alkyl or aralkyl group, and is not H.

$R^2$—represents H or methyl, and may be the same or different.
$R^3, R^4$—represent optionally substituted alkyl, aralkyl, alkylene or aralkylene groups, and may be the same or different.
$R^5, R^6$—represent H or alkylene groups and may be the same or different. $R^5$ and $R^6$ may combine with $R^3$ and $R^4$ respectively each to form a heterocycle ring containing the nitrogen atom to which $R^3$ and $R^4$ are attached.
A—represents a monovalent anionic group which may be independent or may form part of $R^1$. $R^1 A$ may be, for example—$CH_2 CH_2 CH_2 SO_3^-$.

Formulae I to VII illustrate examples of the moiety:

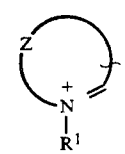

I

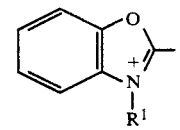

II

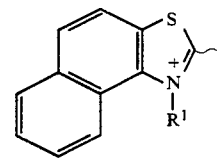

III

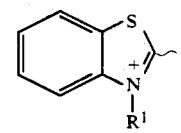

IV

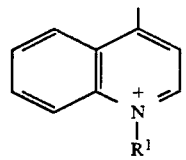

V

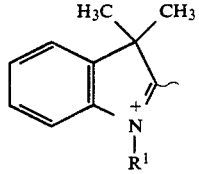

VI

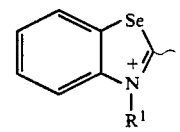

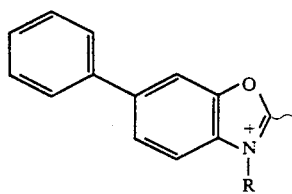

VII

Formulae VIII to XVII illustrate examples of preferred starting materials for the preparation of the dyes of the present invention. The groups $R^1$ to $R^6$ are as defined above.

(i) Nitrogen containing heterocyclic methylene compound

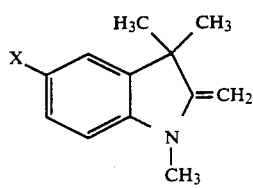

VIII where X=H, Cl, methoxy or phenyl (ii) Quaternary salt of the heterocyclic nitrogen compound (Tos⁻ represents p- toluene sulphonate)

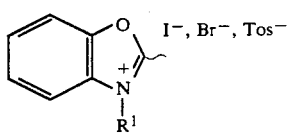

IX

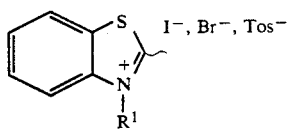

X

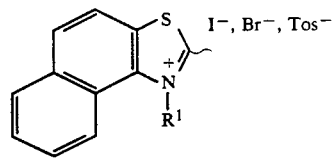

XI

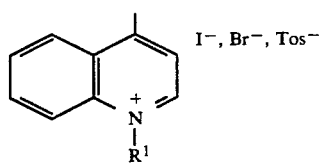

XII

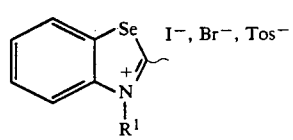

XIII

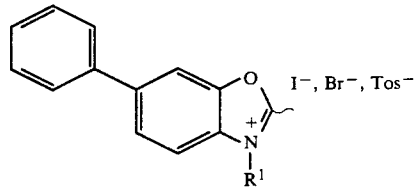

XIV

The formulation of the methylene group in situ from the quaternary salt of the heterocyclic nitrogen compound is particularly preferred since this method facilitates variation of the alkyl substituent of the heterocyclic nitrogen which affects the colour of the final dye.

(iii) Aromatic dialkylamino substituted aldehyde

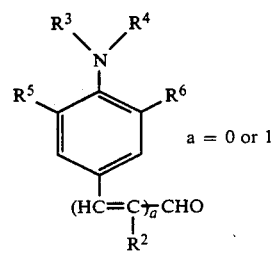

XV a = 0 or 1

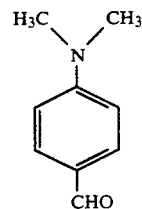

XVI

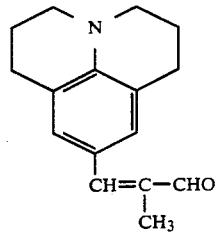

XVII

Where the initial aldehyde is for example a derivative of benzaldehyde, the resulting dye will be a styryl dye, and where for example the initial aldehyde is a vinylogous aldehyde derivative such as a cinnamaldehyde derivative, butadienyl dyes will be produced. Both the benzaldehyde and vinylogous aldehyde structures may be further substituted by groups such as methyl, enabling significant variations to be produced in the colour and colour strength of the resulting dye. The alkyl amino substituents of the aldehyde may also be varied in order to obtain the desired colour and colour strength of the dye. The alkyl substituents may be for example methyl, ethyl or such like, or, for increased colour strength and to provide a bathochromic shift, more complex structures, for example julolidine, may be used (as in compound XVII).

The anionic portion of the dyes has little, if any, effect on the properties of the dyes other than their solubility. Any anion may be used, for example bromide, iodide, p-toluene sulphonate, perchlorate, hexafluorophosphate, methane sulphonate, trifluoromethane sulphonate or tetrafluoroborate.

Generally, the radiation sensitive composition will contain up to 5% by weight (preferably up to 3% by weight) of the dye, based on the weight of the composition.

In the following examples which illustrate the invention, the positive charge is shown to be associated with a specific nitrogen atom within the dye molecule. In practice, the positive charge will be spread, or delocalised, over the chromophoric structure of the dye.

EXAMPLE 1

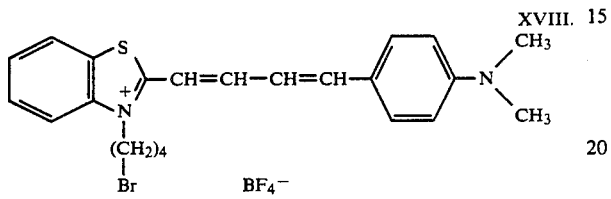

XVIII.

A. 2-Methylbenzothiazole (29.8 g) was reacted with excess 1,4-dibromobutane (86.4 g) at 130° C. for 7 hours. After cooling, the solid formed was filtered off, washed with ethyl acetate and dried in vacuo. The yield amounted to theoretical (73 g).

Elemental analysis (figures in brackets refer to calculated values):

%C 41.20 (39.45) %H 4.27 (4.11) %N 4.53 (3.84) %Br 45.0 (44.0)

B. The quaternary salt obtained in part IA (5.05g) was mixed with iso-propyl alcohol (IPA) (15 ml) containing piperidine (3 drops) and to this suspension was added 4-dimethylaminocinnamaldehyde (2.53 g). The mixture was warmed and held at 50° C. for 5 hours after which time the reaction mix was added dropwise to a solution of sodium tetrafluoroborate (10 g) in water (200 ml). The precipitated blue dye (1B) was filtered H off, washed with dilute (1% w/w) $NaBF_4$ solution and dried at 50° C.

The yield was 69% of theoretical (5.07 g actual).

Analysis by UV showed $\lambda$ max $(CH_3OH) = 571$ nm $\epsilon$ max $= 5.2 \times 10^4$ l.mol$^{-1}$. cm$^1$ Elemental analysis: %C 53.13 (52.17) %H 5.07 (5.01) %N 5.58 (5.30)

C. A positive working coating solution containing the following ingredients was prepared and applied by whirler coating onto a grained and anodised aluminium substrate, to give a dry coating weight of 1.8 g.m, 6 pbw: cresol novolak (Alnovol 429 K)

1.5 pbw: quinone diazide ester which was the reaction product of 2,4-dihydroxy benzophenone (1 mol) with naphthoquinone-(1,2)-diazide-(2)-5-sulphonyl chloride (2 mols)

0.15 pbw: 4-diazonium diphenylamine hexafluorophosphate 0 15 pbw: of polymethine dye 1B 100 pbw: of 90:10 methylethyl ketone (MEK): Methyl oxitol Upon image-wise exposure, the light struck areas were seen to fade, giving a pale green non-image area, relative to a dark blue image area. Unwanted image areas could thus easily be distinguished and removed by conventional means if necessary.

After conventional development and treatment with Thermotect (TM) solution, the image areas were easily visible, being dark blue in colour against a pale grey background.

High temperature treatment of this plate i.e. burning in, as practised in GB 1513368, (230° C. for 8 mins) resulted in the formation of a uniform rich brown colour in the image areas, thereby giving a strong visual indication that the plate had been burned in.

EXAMPLE 2

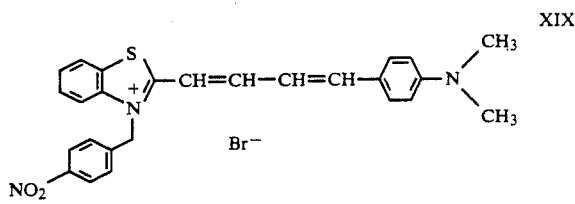

XIX

A. 2-Methyl benzothiazole (2.24 g), 4-nitrobenzyl bromide (3.24 g) and toluene (5 ml) were mixed together and heated to reflux. The quaternary salt precipitated out as it formed and after refluxing for 4 hours, the mixture was cooled. The crude product was filtered off and washed with ether. The yield was 2.32 g, (42% theoretical).

Elemental analysis: %C 47.86 (49.30); %H 3.10 ( 3.56); %N 7.33 ( 7.67);

B. The crude salt from 2A (2 g) was mixed with 4-dimethylaminocinnamaldehyde (0.96 g) dissolved in EtOH (10 ml) containing piperidine (trace). The mixture was warmed and held at 50° C. for 5 hours after which time toluene (10 ml) was added. The reaction mixture was cooled and the precipitated blue solid 2B was filtered off and dried at 50° C. in vacuo. The yield was 1.84 g (64% Theoretical).

Analysis by UV showed: $\lambda$ max $(CH_3OH):600$ nm $\epsilon$ max $= 4.2 \times 10^4$ l.mol$^{-1}$.cm$^1$ Elemental analysis: %C 57.83 (59.77); %H 4.62 ( 4.60); %N 7.97 ( 8.04);

C. A similar coating solution to that of example 1C was prepared, but replacing the polymethine dye 1B with polymethine dye 2B. The overall plate colour (before exposure) was a deep green/blue, giving a colour change on exposure to pale green. Development and burning-in as before gave a deep brown colour in the image areas.

EXAMPLE 3A

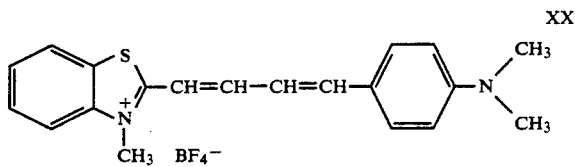

XX

A dye was prepared in a similar manner to the dye of example 1, using equimolar quantities of methyl tosylate and 2-methyl benzothiazole to make the intermediate quaternary salt. This was then reacted in 10 mol % excess with 4-dimethylaminocinnamaldehyde in ethanol containing a trace of piperidine, to give the dye (3A), isolated as the tetrafluoroborate salt. (80% yield).

Analysis: UV: $\lambda$ max $(CH_3OH) = 563$ nm $\epsilon$ max $= 5.7 \times 10^4$ l.mol$^{-1}$.cm$^1$ Elemental analysis: %C 57.97 (58.82); %H 5.03 ( 5.14); %N 6.52 ( 6.63);

Plate testing in a formulation similar to that used for example 1, but using the polymethine dye of the current example, gave equally good results, with the initial plate colour being somewhat redder than that of example 1.

EXAMPLE 3B

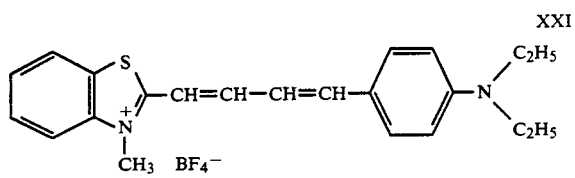

XXI

By replacing the 4-dimethylaminocinnamaldehyde of example 3A with an equimolar amount of 4-diethylaminocinnamaldehyde, a slightly greener dye (3B) was obtained.

UV (CH$_3$OH): λ max=578 nm: ε max=5.8×10$^4$ l.mol$^{-1}$.cm$^{-1}$

Plate testing as before, but using the polymethine dye of the current example, gave equally good results with the initial plate colour being very similar to that of example 1.

EXAMPLE 4

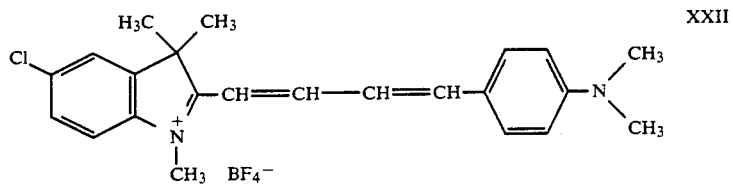

XXII

5-Chloro-2,3-dihydro-1,3,3-trimethyl-2-methylene-1H-indole (165.6 g) was added dropwise and with stirring to a solution of 4-dimethylaminocinnamaldehyde (140 g) dissolved in a mixture of glacial acetic acid (800 cm$^3$) and acetic anhydride (76 cm$^3$). The mixture was warmed to 50° C. and held at 50° C. for 2 hours before isolating into water (4 L). This aqueous slurry was then warmed to 65°-70° C. and filtered whilst still hot. Sodium fluoroborate solution (144 g in 1 L water) was then added to the filtrate to precipitate the dye. The hot mixture was filtered and the solid dye washed with hot (50° C.) water until the filtrate ran clear. The green-blue dye (4) was dried in vacuo at 50° C. The yield was 53%.

Analysis: UV λ max (CH$_3$OH)=625 nm; ε max=7.4×10$^4$ l.mol$^{-1}$.cm$^1$

Elemental Analysis: %C 60.54 (60.99); %H 5.81 ( 5.75); %N 6.32 ( 6.19);

Plate testing in a positive working formulation similar to that used for example 1, but using the dye of the current example, gave equally good results, with the initial plate colour being considerably greener than that of example 1.

A negative working, photopolymerisable composition was prepared from:

6 g dimethacrylate ester of diglycidyl ether of bisphenol A.

2 g Surcol 836 (Allied Colloids) carboxylated acrylic resin.

0.3 g 2,4-bis(trichloromethyl)-6-(4'-methoxynaphthyl)-s-triazine photoinitiator/acid release agent.

0.3 g polymethine dye 4.

200 cm$^3$ MEK solvent.

This coating solution was applied by whirler coating to a grained and anodised aluminium substrate to give a dry coating weight of 0.9–1.0 g.m$^{-2}$. The coated plate was then further treated by overcoating with poly(vinyl alcohol) to reduce oxygen inhibition.

The resultant deep green radiation sensitive plate was image wise exposed, whereby the light struck (i.e. image) areas changed colour to a pale blue-green. The contrast after exposure was thus very good, with the distinction between image and non-image areas being very apparent. After developing in alkaline surfactant solution for about 30 seconds, the image areas darkened to a strong green-blue colour which showed up very well against the pale grey background of the substrate.

The exposed and developed plate was then treated with Thermotect (TM) solution and baked in an oven at 220° C. for 10 minutes. After baking the image areas had a dark brown colour.

EXAMPLES 5-12

XXIII

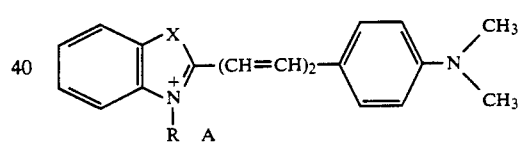

Dyes having the general structure represented by formula XXIII above were prepared by the condensation of 4-dimethylaminocinnammaldehyde with a heterocyclic quaternary salt or heterocyclic active methylene containing compound as indicated in table 1. The medium used to effect this condensation reaction is referred to under the column headed "METHOD"; this term also applies to tables 2, 3 and 4.

EXAMPLES 13-16

Dyes having the general structure represented by formula XXIV were prepared by condensing 3-[4-(dimethylamino)phenyl]-2-methylprop-2-enal with a heterocyclic quaternary salt or heterocyclic active methylene compound, as indicated in table 2, by the method previously described.

XXIV

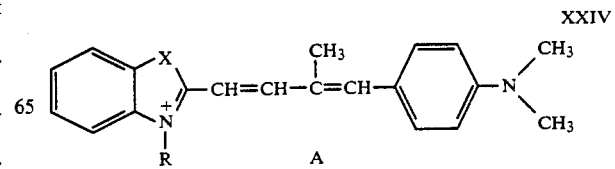

TABLE 1

| Example | X | R | A | METHOD | YIELD % | UV (CH₃OH) $\lambda$max (nm) | $\epsilon$ (l·mol⁻¹·cm⁻¹) × 10⁴ |
|---|---|---|---|---|---|---|---|
| 5 | —S— | —CH₂—C₆H₅ (benzyl) | Br⁻ | IMS/Piperidine | 76 | 583 | 5.8 |
| 6 | —S— | —C₂H₅ | CH₃—C₆H₄—SO₃⁻ | IPA/Piperidine | 64 | 550 | 5.4 |
| 7 | —S— | —CH₂—C₆H₄—Br | Br⁻ | IPA/Piperidine | 89 | 590 | 5.5 |
| 8 | —S— | —C₄H₉ | BF₄⁻ | IPA/Piperidine | 74 | 568 | 5.9 |
| 9 | —Se— | —CH₃ | CH₃—C₆H₄—SO₃⁻ | IPA/Piperidine | 84 | 571 | 4.8 |
| 10 | —CH=CH— | —CH₂—C₆H₅ | Br⁻ | IPA/Piperidine | 32 | 576 | 4.9 |
| 11 | —CH=CH— | —CH₃ | BF₄⁻ | IPA/Piperidine | 29 | 556 | 4.9 |
| 12 | H₃C—C(CH₃)— (C(CH₃)₂) | —CH₃ | BF₄⁻ | AcOH/Ac₂O | 85 | 570 | 5.1 |

IMS = industrial methylated spirit; IPA = isopropyl alcohol
AcOH = glacial acetic acid; Ac₂O = acetic acid anhydride

PREPARATION OF THE ALDEHYDE

4-Dimethylaminobenzaldehyde (119.4 g) was added portionwise to stirred and cooled 98% sulphuric acid (400 cm³), keeping the temperature below 25° C. When all the aldehyde had dissolved, the solution was cooled to −5° C. and propionaldehyde (61 cm³) was added dropwise, keeping the temperature below 0° C. throughout the addition. The reaction mixture was then stirred at −5° C. to 0° C. for a further four days before adding to iced water (7.5 L), using further ice or external cooling as necessary to keep the temperature below 25° C. The diluted reaction mixture was screened through a filter aid to remove a small amount of tarry matter and the filtrates were partially neutralised by the dropwise addition of sodium hydroxide solution, again cooling to keep the temperature below 25° C. The precipitated product was filtered off, washed well with water and dried at 50° C. in vacuo. The crude product was recrystallised from ethanol (1 L) to give the pure aldehyde. The yield was 96 g (64% theoretical).

Melting point: 110°–112 ° C.
Elemental analysis: %C 74.63 (76.19);
%H 7.22 ( 7.94);
%N 7.01 ( 7.41);

Other analogous aldehydes can be prepared in the same manner. For example, by substituting 4-diethylaminobenzaldehyde for the 4-dimethylaminobenzaldehyde used above, the aldehyde 3-[4-(diethylamino)phenyl]-2-methylprop-2-enal is generated (melting point 91° to 93° C.; elemental analysis: %C 76.96 (77.40), %H 8.63 (8.75), %N 6.15 (6.45)).

EXAMPLES 17–20

Dyes having the general structure represented by formula XXV were prepared by condensing 9-formyljulolidine with a heterocyclic quaternary salt or heterocyclic active methylene compound, as shown in table 3, by the method previously described.

TABLE 2

| Example | X | R | A | METHOD | YIELD % | UV (CH₃OH) $\lambda$ max (nm) | $\epsilon$ (l.mol⁻¹·cm⁻¹) × 10⁴ |
|---|---|---|---|---|---|---|---|
| 13 | —S— | —CH₃ | BF₄⁻ | IPA/Piperidine | 31 | 523 | 6.7 |
| 14 | —CH=CH— | —CH₃ | BF₄⁻ | IPA/Piperidine | 40 | 535 | 3.4 |
| 15 | —O— | —CH₃ | BF₄⁻ | IPA/Piperidine | 45 | 522 | 4.5 |
| 16 | —S— | —C₂H₅ | I⁻ | IPA/Piperidine | 80 | 546 | 4.9 |

TABLE 3

| Example | X | R | Y | A | METHOD | YIELD % | UV (CH₃OH) λmax (nm) | ε max × 10⁴ (1·mol.⁻¹·cm⁻¹) |
|---|---|---|---|---|---|---|---|---|
| 17 | —S— | —CH₃ | —H | 4-CH₃-C₆H₄-SO₃⁻ | IMS/Piperidine | 50 | 565 | 8.1 |
| 18 | —S— | —C₂H₅ | —H | I⁻ | IMS/Piperidine | 70 | 572 | 7.1 |
| 19 | —O— | —CH₃ | C₆H₅ | BF₄⁻ | IPA/Piperidine | 50 | 538 | 5.5 |
| 20 | C(CH₃)₂ | —CH₃ | —Cl | BF₄⁻ | AcOH/Ac₂O | 75 | 640 | 6.3 |

9-Formyljulolidine can be prepared according to the method of Smith and Yu, J. Org. Chem., 17 (1952) 1286.

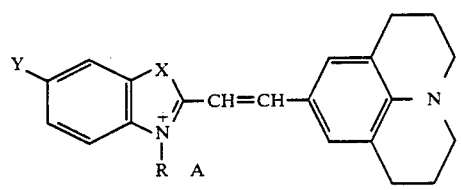

XXV

EXAMPLES 21-25

Dyes having the structures represented by formulas XXVI-XXX, shown in table 4, were prepared by condensing various, commercially available, alkylamino substituted aromatic aldehydes with suitable heterocyclic quaternary salts or heterocyclic active methylene compounds, in the manner described previously. The heterocyclic quaternary salts are generally known and can be prepared according to the procedures described in, for example, Photographic Chemistry Vol. II by Pierre Glafkides pp 768-775, and DT.1569790 (1977).

EXAMPLE 26

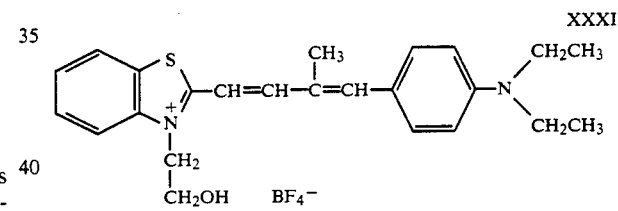

XXXI

TABLE 4

| Example | METHOD | YIELD % | UV(CH₃OH) λmax (nm) | εmax × 10⁴ (1·mol⁻¹·cm⁻¹) |
|---|---|---|---|---|
| 21/XXVI | IPA/Piperidine | 80 | 556 | 5.5 |
| 22/XXVII | IPA/Piperidine | 30 | 542 | 4.2 |
| 23/XXVIII | | | | |

TABLE 4-continued

| Example | METHOD | YIELD % | UV(CH₃OH) λmax (nm) | εmax × 10⁴ (l·mol⁻¹·cm⁻¹) |
|---|---|---|---|---|
| 24/XXIX  H₃C—N⁺ quinolinium—(CH=CH)₂—C₆H₄—N(CH₃)₂  BF₄⁻ | IPA/Piperidine | 38 | 558 | 5.0 |
| 25/XXX  benzothiazolium (N-(CH₂)₃SO₃⁻)—(CH=CH)₂—C₆H₄—N(CH₃)₂ | IPA/Piperidine | 85 | 565 | 4.0 |
| 26/XXXI (approx.)  benzothiazolium (N-CH₂-C₆H₄-CO₂⁻)—(CH=CH)₂—C₆H₄—N(C₂H₅)₂ | IPA/Piperidine | 30 | 598 | 5.3 |

A. 2-methylbenzothiazole (89.4 g, 2-bromoethanol (82.5 g) and toluene (160 ml) were mixed together and heated to reflux. After refluxing for approximately 24 hours, the mixture was allowed to cool during which time the quaternary salt precipitated out. The crude product was filtered and washed with toluene. The yield was 111.8 g (67.9% theoretical).

Elemental analysis: %C 43.62 (43.79); %H 4.26 ( 4.38); %N 5.24 ( 5.11); %Br 29.00 (29.20);

B. The crude quaternary salt obtained in 26A (25 g) was mixed with 3-[4-(diethylamino)phenyl]-2-methyl-prop-2-enal (16.46 g) and isopropyl alcohol (110 ml). The mixture was heated to reflux with stirring. After refluxing for 48 hours the reaction mixture was cooled and filtered. The crude solid product was dissolved in N-methyl pyrrolidone (750 ml) and this solution was added dropwise to a solution of sodium fluoroborate (150 g) in water (5 l). The precipitated blue dye (26B) was filtered off, washed with dilute (1% w/w) NaBF solution and dried at 50° C. The yield was 13.36 g (37% theoretical).

Analysis by UV showed: λ max (CH₃OH) : 556nm ε max=5.52×10⁴ l.mol⁻¹.cm⁻¹

Elemental analysis: %C 59.12 (59.75); %H 6.50 ( 6.43); %N 5.26 ( 5.81);

EXAMPLE 27

The dyes of Examples 5 to 26 were tested for their colour change properties in positive working printing plates by adding them separately and at the indicated concentration, to one of three coating formulations as shown below.

The coating solutions were then applied to a grained and anodised aluminium substrate to give a dry coating weight of 1.6-1.8 gm.⁻². After conventional image-wise exposure and development, the printing plates were treated with Thermotect (TM) solution prior to burning-in. The plates were examined for colour changes at each stage, and the results are displayed in table 5.

Coating formulations

1:
6 pbw cresol novolak (Alnovol 429K)
1.5 pbw quinone diazide ester as previously described
0.15 pbw 2,4-bis(trichloromethyl)-6-(4'-methoxynaphthyl)-s-triazine
0.15 pbw polymethine dye
100 pbv 90:10 MEK:Methyl oxitol 2:
6 pbw cresol novolak (Alnovol 429K)
1.5 pbw quinone diazide ester as previously described
0.15 pbw 2,4-bis-(trichloromethyl)-6-(3',4'-methylenedioxyphenyl)-s-triazine
0.15 pbw polymethine dye
100 pbv 1-methoxy-2-propanol 3:
6 pbw cresol novolak (Alnovol 429K)
1.5 pbw quinone diazide ester as previously described
0.15 pbw 4-diazonium diphenylamine hexafluorphosphate
0.15 pbw polymethine dye
100 pbv 90:10 MEK:Methyl oxitol

TABLE 5

Plate Colour at Various Stages of Production

| Dye | Coating Formulation | Original | Post Exposed (Non-Image Area) | Post Exposed (Image Area) | Post Burning-in 215–235° C. (Image Area) |
|---|---|---|---|---|---|
| 5 | 1 | Green/Blue | Pale Green | Green/Blue | Dark Brown |
| 6 | 1 | Violet | Light Brown | Purple | Dark Brown |
| 7 | 2 | Green | Pale Green | Green | Brown |
| 8 | 3 | Blue-Green | Pale Blue | Green | Brown |
| 9 | 1 | Blue | Pale Blue | Blue | Dark Brown |
| 10 | 1 | Blue/Green | Pale Blue | Green | Dark Brown |
| 11 | 3 | Violet | Lilac | Indigo | Brown |
| 12 | 1 | Blue | Pale Blue | Blue | Dark Brown |
| 13 | 1 | Brick Red | Pink | Salmon | Dark Brown |
| 14 | 1 | Red | Pink | Red | Brown |
| 15 | 1 | Orange-Red | Pale Orange | Orange | Brown |
| 16 | 2 | Magenta | Lilac | Magenta | Dark Brown |
| 17 | 1 | Blue | Pale Blue | Blue | Brown |
| 18 | 2 | Turquoise | Pale Blue | Green | Brown |
| 19 | 1 | Red | Pink | Red | Brown |
| 20 | 2 | Green | Pale Green | Green | Brown |
| 21 | 3 | Purple | Pale Violet | Lilac | Dark Brown |
| 22 | 1 | Indigo | Pink | Violet | Brown |
| 23 | 1 | Deep Violet | Lilac | Violet | Dark Brown |
| 24 | 2 | Blue | Pale Blue | Blue | Dark Brown |
| 25 | 2 | Green | Pale Green | Green | Dark Brown |
| 26B | 1 | Deep Violet | Lilac | Violet | Dark Brown |

COMPARATIVE EXAMPLE 1

A positive working coating formulation was prepared from the following ingredients:
18 g cresol novolak (Alnovol 429K)
4.5 g quinone diazide ester as described previously
0.45 g 2,4-bis(trichloromethyl)-6-(4′-methoxynaphthyl)-s-triazine The mixture was then made up to 300 cm$^3$ with 90/10 MEK/Methyl oxitol, and divided into three portions.

A first coating solution was prepared by adding 0.15 g of a conventional pH sensitive dye (Crystal Violet) to portion 1.

A second coating solution was prepared by adding 0.15 g of a known heat sensitive dye (example 4 of EP 0127477) to portion 2.

A third coating solution was prepared by adding 0.15 g of the polymethine dye of Example 8 having the structure shown in table 1 to portion 3.

Each of these three coating solutions was then respectively whirler coated onto a grained and anodised aluminium substrate, to give dry coating weights between 1.7–1.9 gm$^{-2}$, thereby to produce first, second and third radiation sensitive substrates.

After conventional image-wise exposure and development of the substrate, the resulting printing plates were then treated with Thermotect (TM) solution prior to burning-in by baking at various temperatures over the range 160° C. to 270° C. The plates were examined for colour change at each stage, and the results are displayed in table 6. A further sample of the third printing plate was not treated with the Thermotect (TM) solution and was not baked.

As can be seen, the polymethine dye gives a good colour change on exposure, in combination with a rapid and highly visible colour change during burning-in.

TABLE 6

| Plate | Original Plate Colour | Exposed Plate Colour (non-image areas) | Image Colour after development | Baked Image Colour (after 10 mins. at indicated temp.) | | | | |
|---|---|---|---|---|---|---|---|---|
| | | | | 160° C. | 180° C. | 200° C. | 220° C. | 270° C. |
| 1 | Violet | Pale Blue | Violet | Violet | Violet | Violet | Violet | Khaki Brown |
| 2 | Green | Green | Green | Dull Olive | Grey | Reddish Brown | Reddish Brown | Reddish Brown |
| 3 | Blue-Green | Pale Blue | Blue-Green | Blue-Green | Mid-Brown | Dark Brown | Dark Brown | Dark Brown |

The conventional pH sensitive dye is very reluctant to change colour in the burning-in process, whilst the heat sensitive azo dye gives no discernible colour change on exposure.

The respective baked and un-baked samples of plate 3 were mounted on an offset printing press. The unbaked plate gave 120,000 prints and the baked and Thermotect (TM) treated plate gave 500,000 prints before the print quality deteriorated due to image wear.

COMPARATIVE EXAMPLE 2

A negative working, photopolymerisable coating composition was prepared from:
9 g of the dimethacrylate ester of diglycidyl ether of Bisphenol A.
3 g of a vinyl acetate/crotonic acid copolymer.
0.45 g of 2,4-bis(trichloromethyl)-6-(4′-methoxynaphthyl)-s-triazine.
300 cm$^3$ methyl ethyl ketone.

This solution was divided into three equal portions.

A first coating solution was prepared by adding 0.15 g of a conventional pH sensitive blue dye (Crystal Violet) to portion 1.

A second coating solution was prepared by adding 0.15 g of a known heat sensitive dye (Example 4 of EP 0127477) to portion 2.

A third coating solution was prepared by adding 0.15 g of the polymethine dye of Example 17, having the structure shown in Table 3 to portion 3.

Each of the three coating solutions was then respectively whirler coated onto a grained and anodised aluminium substrate, to give dry coating weights between 0.9–1.0 g.m$^{-2}$. The first, second and third dried coated plates thus produced were then overcoated with poly(vinyl alcohol) to prevent oxygen inhibition.

After conventional image-wise exposure and subsequent development in an aqueous alkaline developer, the plates were treated with a 10% aqueous solution of sodium dodecyl phenoxybenzene disulphonate (protective substance to prevent contamination of the substrate surface) and buffed down until dry. The plates were then burned-in at various temperatures over the range 160° C. –270° C. The plates were examined for colour change at each stage, and the results are displayed in Table 7. One sample of plate 3 was not treated and was not baked.

As can be seen, both of the pH sensitive dyes (i.e. in plates 1 and 3) gave a good colour change on exposure and all three plates demonstrated a good contrast after development. Only plates 2 and 3 however, gave a good visual indication that suitable baking had taken place.

The respective baked and un-baked samples of Plate 3 were mounted on an offset printing press. The un-baked plate gave 80,000 good printed copies whereas the baked plate have 240,000 good printed copies.

4. A composition as claimed in claim 1, wherein the dye has the general structure

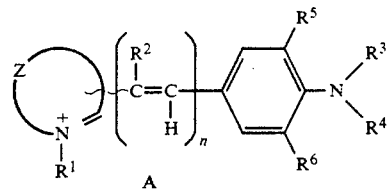

where
Z represents a divalent group which forms a heterocycle ring structure with the nitrogen atom,
$R^1$ represents an optionally substituted alkyl or aralkyl group, and is not H,
$R^2$ represents H or methyl,
$R^3, R^4$ represent optionally substituted alkyl, aralkyl, alkylene or aralkylene groups and may be the same or different,
$R^5, R^6$ represent H or alkylene groups, and may be the same or different and
A represents a monovalent anionic group.

TABLE 7

| | Original Plate Colour | Exposed Plate Colour (non-image areas) | Image Colour after development | Baked Image Colour (after 10 mins. at indicated temp.) | | | | |
| Plate | | | | 160° C. | 180° C. | 200° C. | 220° C. | 270° C. |
| --- | --- | --- | --- | --- | --- | --- | --- | --- |
| 1 | Violet | Pale Blue | Dark Blue | Dark Blue | Dark Blue | Dark Blue | Dark Blue | Khaki Brown |
| 2 | Green | Green | Green | Olive-Green | Grey-Green | Brown | Brown | Very Dark Brown |
| 3 | Deep Blue | Pale Blue | Dark Blue | Dark Blue | Light Brown | Dark Brown | Dark Brown | Dark Brown |

We claim:

1. A radiation sensitive composition comprising a radiation sensitive material and a dye wherein, on image-wise exposure of the said composition so that said composition comprises radiation-struck areas and non-radiation-struck areas, the said dye undergoes a colour change in the radiation-struck areas and wherein said dye is a heat sensitive dye which undergoes a colour change at a temperature of at least 180° C.

2. A composition as claimed in claim 1 wherein said dye comprises the product of the condensation reaction of an aromatic dialkylamino substituted aldehyde and a methylene group attached to a nitrogen containing heterocycle and wherein the dye has a chromophoric resonance conjugation system and a positive charge distributed over the system.

3. A composition as claimed in claim 2 wherein the methylene group is generated in situ from a quaternary ammonium salt of the nitrogen containing heterocycle.

5. A composition as claimed in claim 4 wherein $R^3$ and $R^5$ are fused to form a heterocycle ring containing the nitrogen atom to which $R^3$ is attached.

6. A composition as claimed in claim 4 wherein $R^4$ and $R^6$ are fused to form a heterocycle ring containing the nitrogen atom to which $R^4$ is attached.

7. A composition as claimed in claim 4 wherein $R^3$ and $R^5$, and $R^4$ and $R^6$, respectively are fused to form a heterocycle ring containing the nitrogen atom to which $R^3$ and $R^4$ are attached.

8. A composition as claimed in claim 1 wherein the composition comprises not more than 5% by weight of the dye.

9. A composition as claimed in claim 1 wherein the dye is an acid sensitive dye and wherein the composition further comprises an acid release agent which produces acid in the radiation-struck areas on exposure of the composition.

10. A radiation sensitive device comprising a substrate coated with a radiation sensitive composition as claimed in claim 1.

* * * * *

UNITED STATES PATENT AND TRADEMARK OFFICE
CERTIFICATE OF CORRECTION

PATENT NO. : 5,130,228
DATED : July 14, 1992
INVENTOR(S) : John R. Wade, et al It is certified that error appears in the above-identified patent and that said Letters Patent is hereby corrected as shown below:

Column 1, line 4 after "relates" insert -to-
Column 7, line 59 change "015" to -0.15-

Signed and Sealed this

Fourteenth Day of September, 1993

*Attest:*

BRUCE LEHMAN

*Attesting Officer*        *Commissioner of Patents and Trademarks*